(12) United States Patent
Hsieh et al.

(10) Patent No.: US 10,948,240 B2
(45) Date of Patent: Mar. 16, 2021

(54) VAPOR CHAMBER STRUCTURE

(71) Applicant: ASIA VITAL COMPONENTS CO., LTD., New Taipei (TW)

(72) Inventors: Kuo-Chun Hsieh, New Taipei (TW); Tsung-Hsien Tsai, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 15/840,496

(22) Filed: Dec. 13, 2017

(65) Prior Publication Data
US 2018/0100708 A1 Apr. 12, 2018

Related U.S. Application Data

(63) Continuation-in-part of application No. 15/183,792, filed on Jun. 16, 2016.

(51) Int. Cl.
| | |
|---|---|
| *F28D 15/02* | (2006.01) |
| *F28D 15/04* | (2006.01) |
| *H01L 23/427* | (2006.01) |
| *F28F 21/08* | (2006.01) |
| *G06F 1/20* | (2006.01) |

(Continued)

(52) U.S. Cl.
CPC ..... *F28D 15/0275* (2013.01); *F28D 15/0233* (2013.01); *F28D 15/046* (2013.01); *F28F 21/083* (2013.01); *F28F 21/086* (2013.01); *G06F 1/203* (2013.01); *H01L 23/427* (2013.01); *H01L 23/467* (2013.01); *F28D 2021/0028* (2013.01); *F28F 2250/08* (2013.01); *G06F 2200/201* (2013.01); *H01L 23/3672* (2013.01)

(58) Field of Classification Search
CPC ............. F28D 15/0233; F28D 15/0275; F28D 15/046; H01L 23/42; H05K 7/20154; H05K 7/20163; H05K 7/20172; H05K 7/20336; H05K 2201/064
See application file for complete search history.

(56) References Cited

U.S. PATENT DOCUMENTS

| | | | | |
|---|---|---|---|---|
| 6,082,443 A | * | 7/2000 | Yamamoto | ........... F28D 15/0233 165/104.21 |
| 6,241,007 B1 | * | 6/2001 | Kitahara | ................ H01L 23/467 165/185 |

(Continued)

*Primary Examiner* — Eric S Ruppert
*Assistant Examiner* — Hans R Weiland
(74) *Attorney, Agent, or Firm* — Demian K. Jackson; Jackson IPG PLLC

(57) ABSTRACT

A vapor chamber structure includes a main body, a fan and perforations. The main body has a heat absorption section, a heat dissipation section and a chamber. The heat absorption section and the heat dissipation section are respectively horizontally disposed on left and right sides of the main body. The heat absorption section is attached to at least one heat source. The chamber is positioned at the heat absorption section and partially extends to the heat dissipation section. The chamber has a capillary structure and at least one perforated section. The perforated section is connected between an upper side and a lower side of the chamber. The fan is disposed on one side of the heat dissipation section. The perforations are formed through the parts of the main body, which parts are free from the chamber and the parts of the main body, where the perforated section is disposed.

13 Claims, 9 Drawing Sheets

(51) Int. Cl.
*H01L 23/467* (2006.01)
*F28D 21/00* (2006.01)
*H01L 23/367* (2006.01)

(56) References Cited

U.S. PATENT DOCUMENTS

| | | | | |
|---|---|---|---|---|
| 6,302,192 | B1 * | 10/2001 | Dussinger | F28D 15/0233 165/104.21 |
| 6,535,386 | B2 * | 3/2003 | Sathe | H01L 23/427 165/104.33 |
| 6,650,544 | B1 * | 11/2003 | Lai | H01L 23/427 165/104.21 |
| 7,677,299 | B2 * | 3/2010 | Zheng | F28D 15/0233 165/104.26 |
| 9,578,780 | B1 * | 2/2017 | Shih | H01L 23/427 |
| 2006/0198753 | A1 * | 9/2006 | Hong | B22F 1/0014 419/23 |
| 2007/0295486 | A1 * | 12/2007 | Su | F28D 15/0233 165/104.26 |
| 2008/0087405 | A1 * | 4/2008 | Meng | F28D 15/0283 165/104.26 |
| 2009/0211095 | A1 * | 8/2009 | Zheng | F28D 15/0233 29/890.032 |
| 2010/0139895 | A1 * | 6/2010 | Hwang | H01L 23/427 165/104.26 |
| 2012/0106084 | A1 * | 5/2012 | Mizuta | F28D 15/046 361/700 |
| 2013/0092353 | A1 * | 4/2013 | Yang | F28D 15/04 165/104.26 |
| 2015/0285562 | A1 * | 10/2015 | Huang | F28D 15/0233 165/104.21 |
| 2015/0289413 | A1 * | 10/2015 | Rush | H05K 7/20672 361/700 |
| 2017/0031394 | A1 * | 2/2017 | Yang | H05K 7/20336 |
| 2017/0064868 | A1 * | 3/2017 | Rush | H05K 7/20336 |
| 2019/0027425 | A1 * | 1/2019 | Mira | F28D 15/0275 |
| 2019/0218667 | A1 * | 7/2019 | Mizoguchi | H01L 23/367 |

* cited by examiner

VAPOR CHAMBER STRUCTURE

The present application is a Continuation-in-Part of U.S. patent application Ser. No. 15/183,792 filed on Jun. 16, 2016.

BACKGROUND OF THE INVENTION

1. Field of the Invention

The present invention relates generally to a vapor chamber structure, and more particularly to a thinned vapor chamber structure connected with a cooling fan.

2. Description of the Related Art

The current handheld devices, tablets, ultrathin notebooks, mobile devices and the like electronic apparatuses have become thinner and thinner. With the enhancement of the working performance, the power of the internal calculation unit (CPU) of the electronic apparatus is increased. With the increase of the power of the calculation unit (CPU), the heat generated by the calculation unit (CPU) is increased. The heat must be forcedly dissipated by a heat dissipation component. Otherwise, the heat can be hardly properly dissipated. Therefore, it is necessary to arrange heat dissipation components such as heat pipe, vapor chamber, heat sink, radiating fins and cooling fan in the electronic apparatus to help in dissipating the heat so as to prevent the calculation unit (CPU) from overheating to affect the working or cause burnout.

Moreover, the current electronic apparatus has become thinner and thinner and lighter and lighter. Therefore, the remaining space for arrangement of the heat dissipation components is quite limited. When installed, one side of the vapor chamber is attached to the heat source (the calculation unit (CPU)). The vapor chamber is secured to the heat source by means of latch device. Due to the limitation of the space, after the latch device is overlaid on the vapor chamber, the height may exceed the height of the preset arrangement space. In case the vapor chamber is directly locked on the heat source (the calculation unit (CPU)) without using the latch device, the vapor chamber will be damaged to lose its airtight state. Also, due to the limitation of the space, it is impossible to additionally install any radiating fin or cooling fan in the electronic apparatus. Therefore, it has become a critical issue how to arrange the heat dissipation components in the limited space and tightly secure the heat dissipation components on the heat source.

SUMMARY OF THE INVENTION

It is therefore a primary object of the present invention to provide a thinned vapor chamber structure, which is connected with a cooling fan.

To achieve the above and other objects, the vapor chamber structure of the present invention includes a main body, a fan and multiple perforations.

The main body has a heat absorption section, a heat dissipation section and a chamber. The heat absorption section and the heat dissipation section are respectively horizontally disposed on left and right sides of the main body. The heat absorption section is attached to at least one heat source. The chamber is positioned at the heat absorption section and partially extends to the heat dissipation section. The chamber has a capillary structure and at least one perforated section. The perforated section is connected between an upper side and a lower side of the chamber.

The fan is disposed on one side of the heat dissipation section.

The perforations are formed through the parts of the main body, which parts are free from the chamber and the parts of the main body, where the perforated section is disposed.

The vapor chamber structure of the present invention is a very thin structure, which can be installed in a limited space and securely assembled with a heat source. After assembled, the internal chamber of the vapor chamber can still keep in an airtight state.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
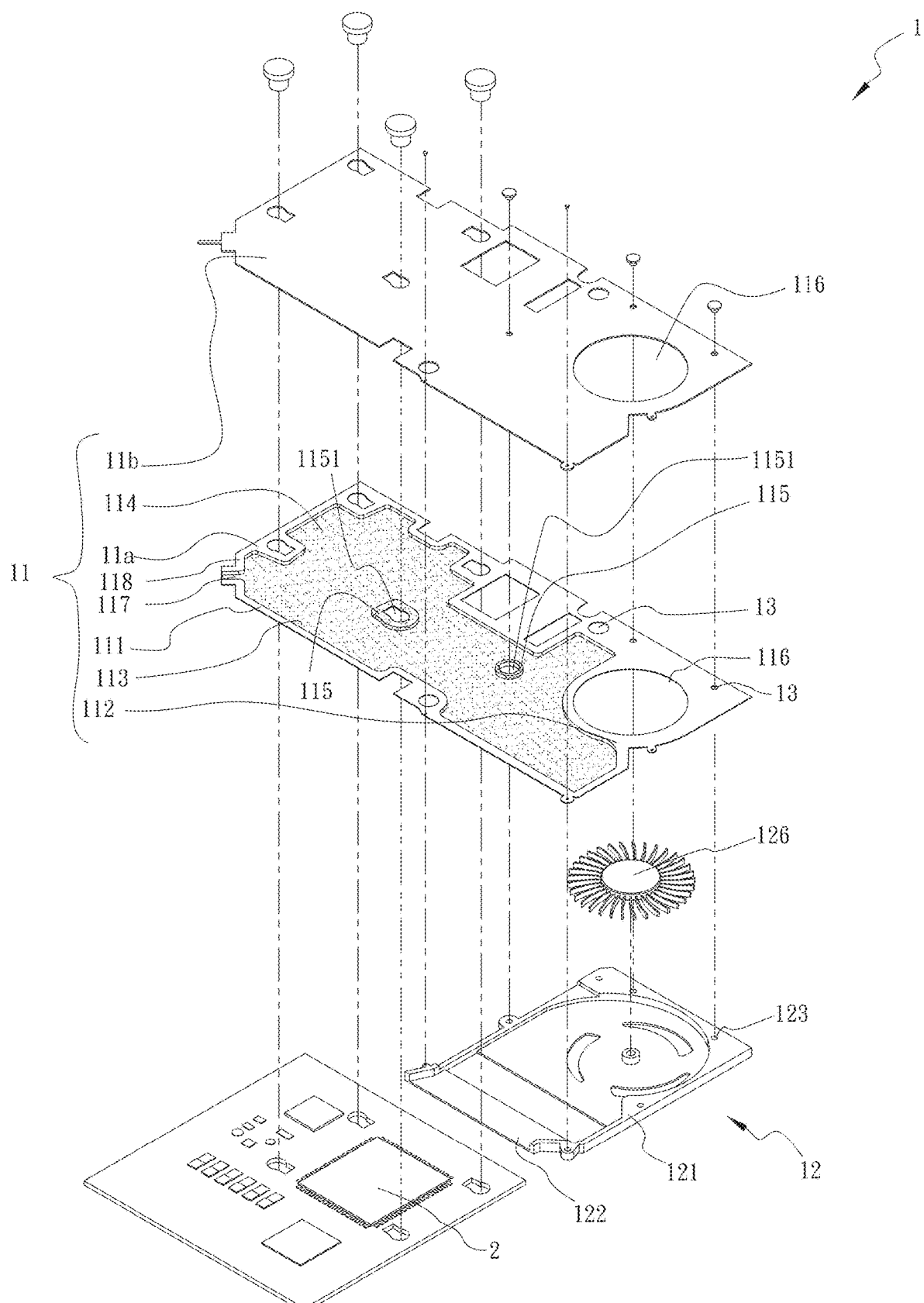
FIG. 1 is a perspective exploded view of a first embodiment of the vapor chamber structure of the present invention.
Figure 2:
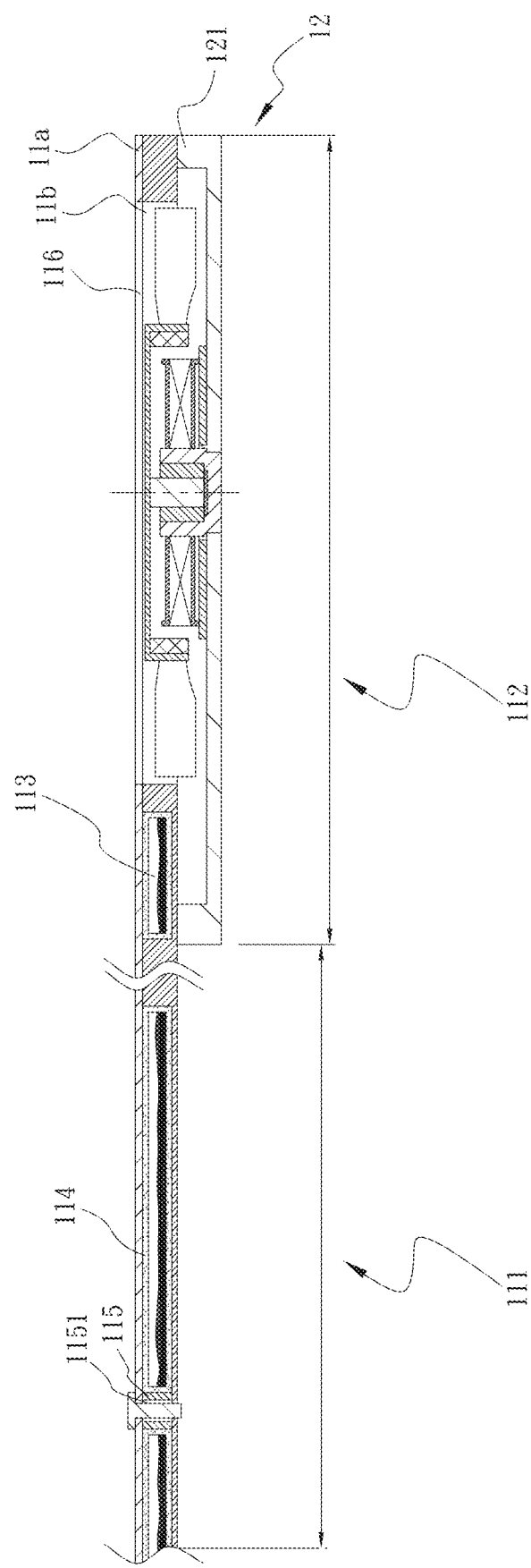
FIG. 2 is a sectional assembled view of the first embodiment of the vapor chamber structure of the present invention.

Please refer to FIGS. 1 and 2. FIG. 1 is a perspective exploded view of a first embodiment of the vapor chamber structure of the present invention. FIG. 2 is a sectional assembled view of the first embodiment of the vapor chamber structure of the present invention. As shown in the drawings, the vapor chamber structure 1 of the present invention includes a main body 11, a fan 12 and multiple perforations 13.

The main body 11 is a flat-plate body and has a heat absorption section 111, a heat dissipation section 112 and a chamber 113. The heat absorption section 111 and the heat dissipation section 112 are respectively horizontally disposed on left and right sides of the main body 11. The heat absorption section 111 is attached to at least one heat source 2. The chamber 113 is positioned at the heat absorption section 111 and partially extends to the heat dissipation section 112. The chamber 113 has a capillary structure 114 and at least one perforated section 115. The perforated section 115 is connected between an upper side and a lower side of the chamber 113. The capillary structure 114 is disposed on wall face of the chamber 113 and outer circumference of the perforated section 115. The main body 11 is made of titanium or stainless steel material.

The fan 12 is correspondingly assembled on one side of the heat dissipation section 112 of the main body 11. The fan 12 is a centrifugal fan. The fan 12 has a fan frame body 121. The main body 11 is correspondingly disposed on an open upper side of the fan frame body 121. In addition, the main body 11 is formed with a window 116 in a position where the fan 12 is disposed. The window 116 serves as an air inlet of the fan 12. The fan frame body 121 has at least one lateral air outlet 122.

The perforations 13 are formed through the parts of the main body 11, which parts are free from the chamber 113, (such as the corners) and the parts of the main body 11, where the perforated section 115 is disposed in the chamber 113 of the main body 11. Under such circumstance, the chamber 113 of the main body 11 can kept airtight.

The main body 11 has a first board body 11*a* and a second board body 11*b*. The first and second board bodies 11*a*, 11*b* are correspondingly mated with each other to respectively serve as the upper and lower sides of the main body 11. After mated with each other, the first and second board bodies 11*a*, 11*b* together define the chamber 113. Two ends of the perforated section 115 are respectively connected with the first and second board bodies 11*a*, 11*b*. The first and second board bodies 11*a*, 11*b* are made of titanium or stainless steel material.

The chamber 113 defined between the first and second board bodies 11*a*, 11*b* is formed in such a manner that one of the first and second board bodies 11*a*, 11*b* is formed with a first recess 117 and the other board body (the second board body 11*b*) is correspondingly mated with the first board body 11*a* to seal the first recess 117. The first recess 117 has an outer periphery 118. The periphery 118 and the perforated section 115 are raised structures relative to the first recess 117. The perforated section 115 is disposed in the first recess 117.

The fan 12 is connected with the main body 11 by means of riveting, adhesion, screwing or injection molding. The fan frame body 121 has multiple locating holes 123 in alignment with some of the perforations 13 of the main body 11. When the fan 12 is connected with the main body 11 by means of riveting or screwing, the rivets or screws are passed through the perforations 13 of the main body 11 and the locating holes 123 of the fan frame body 121 to securely assemble the main body 11 with the fan 12.

Figure 3:
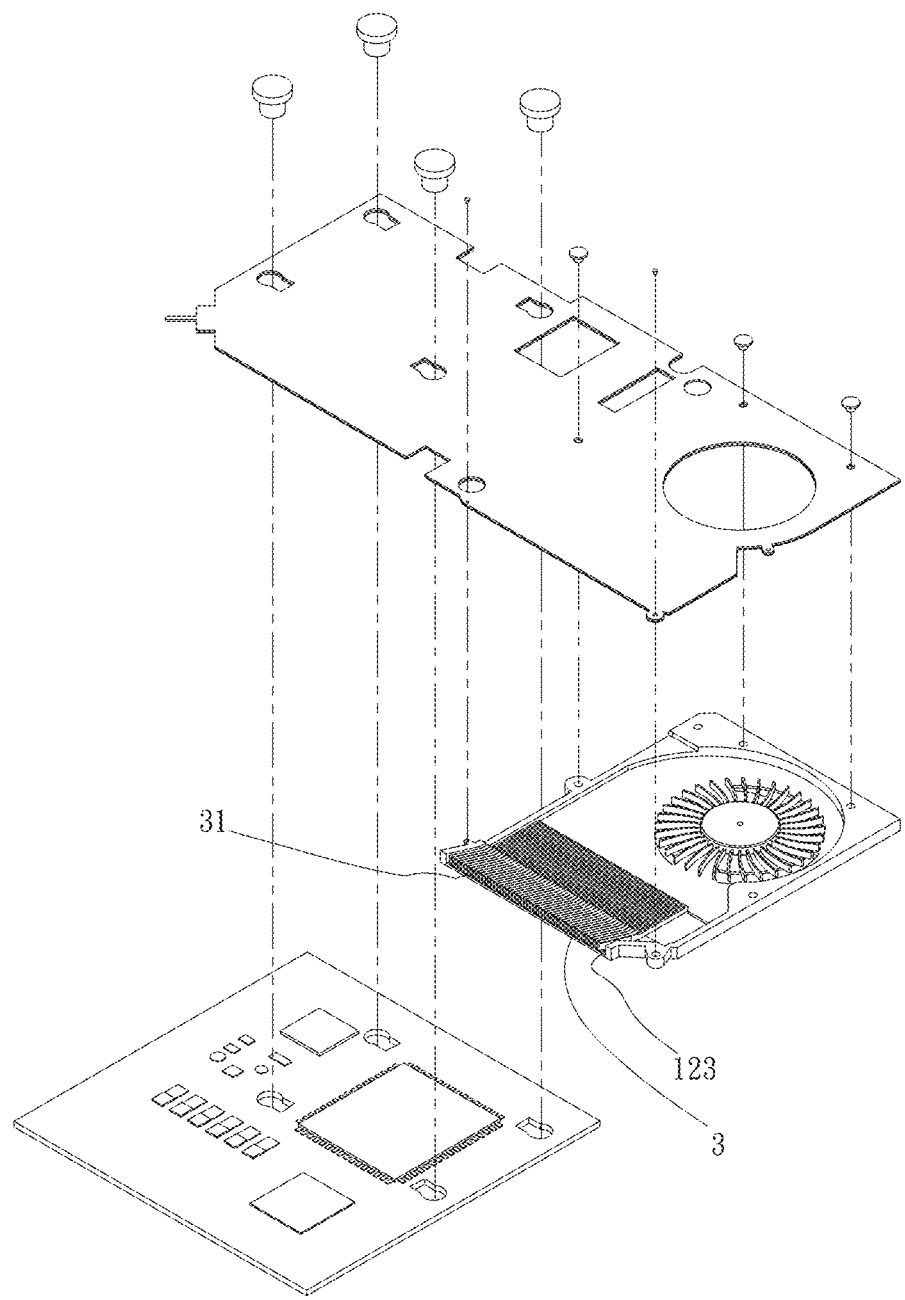
FIG. 3 is a perspective exploded view of a second embodiment of the vapor chamber structure of the present invention.

Please now refer to FIG. 3, which is a perspective exploded view of a second embodiment of the vapor chamber structure of the present invention. The second embodiment is partially identical to the first embodiment in structure and technical characteristic and thus will not be repeatedly described hereinafter. The second embodiment is mainly different from the first embodiment in that multiple radiating fins 3 are disposed in the lateral air outlet 123. The radiating fins 3 are stacked to define at least one flow way 31 between the radiating fins 3.

Figure 4:
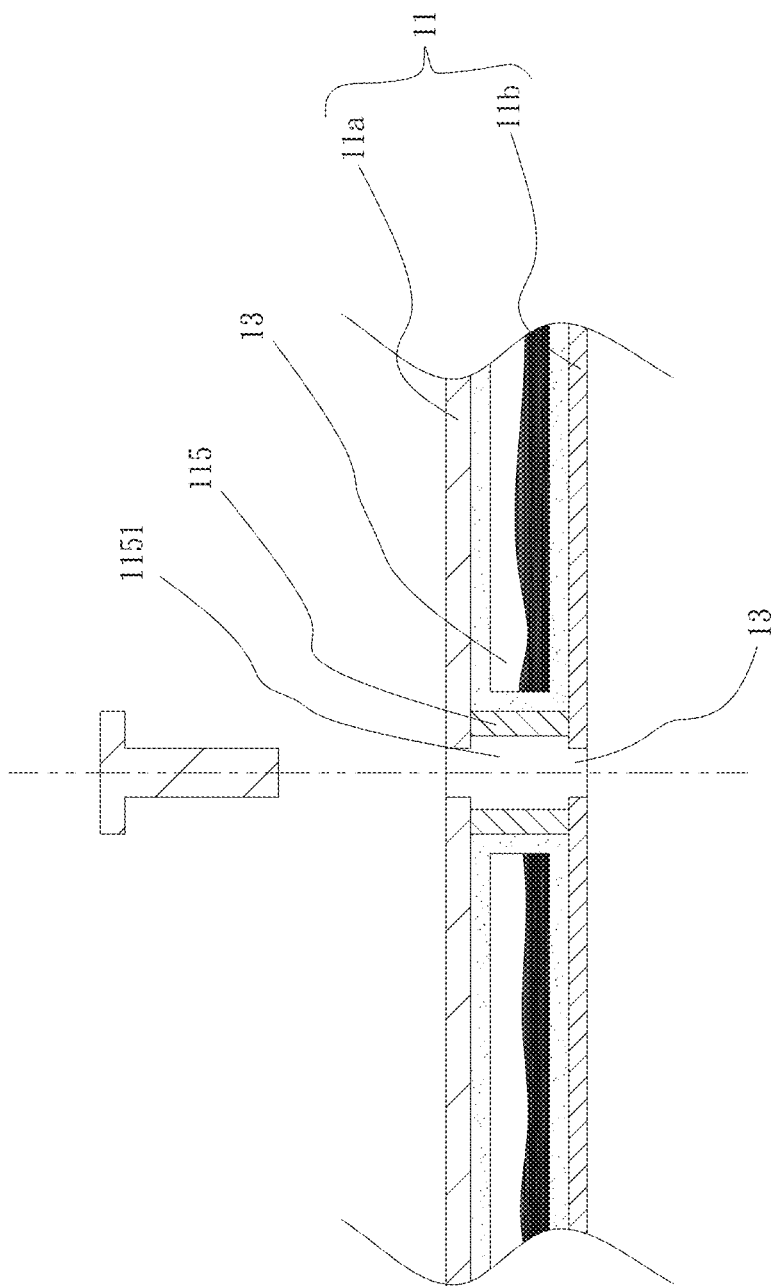
FIG. 4 is a sectional assembled view of a third embodiment of the vapor chamber structure of the present invention.
Figure 5:
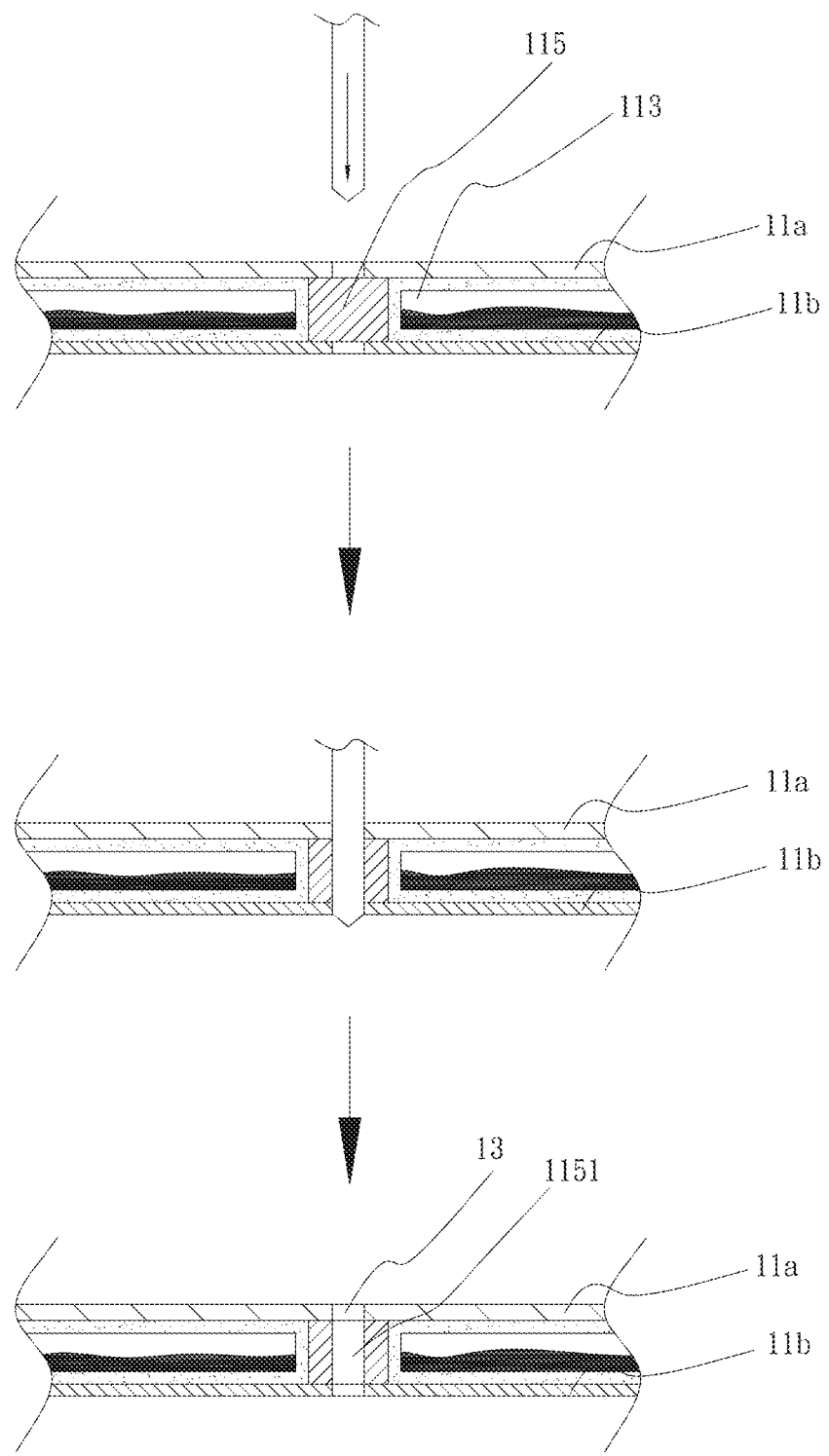
FIG. 5 is a sectional view of the third embodiment of the vapor chamber structure of the present invention, showing the processing method thereof.

Please now refer to FIGS. 4 and 5. FIG. 4 is a sectional assembled view of a third embodiment of the vapor chamber structure of the present invention. FIG. 5 is a sectional view of the third embodiment of the vapor chamber structure of the present invention, showing the processing method thereof. The third embodiment is partially identical to the first embodiment in structure and technical characteristic and thus will not be repeatedly described hereinafter. The third embodiment is mainly different from the first embodiment in that two ends of the perforated section 115 are connected with the upper and lower sides of the chamber 13 by means of diffusion bonding. The perforated section 15 is a hollow collar body. Some of the perforations 13 formed on the first and second board bodies 11*a*, 11*b* are aligned with the perforated section 115 (the hollow collar body). The perforated section 115 (the hollow collar body) has a through hole 1151 passing through the perforated section 115 (the hollow collar body) between two ends thereof. The diameter of the through hole 1151 of the perforated section 115 (the hollow collar body) is larger than or equal to the diameter of the perforations 13. Accordingly, two ends of the perforated section 115 (the hollow collar body) can be connected with the first and second board bodies 11*a*, 11*b* by means of diffusion bonding. Also, the interior of the chamber 13 of the main body 11 can keep vacuumed and airtight.

It should be noted that in this embodiment, the perforated section 115 can be a solid column body disposed in the chamber 113 defined by the first and second board bodies 11*a*, 11*b* in alignment with the perforations 13. Two ends of the perforated section 115 are first respectively connected with the first and second board bodies 11*a*, 11*b*. Then, the first and second board bodies 11*a*, 11*b* and the perforated section 115 are drilled to form the perforations 13 and the through hole 1151. After drilled, the diameter of the through hole 1151 must not be larger than the diameter of the perforations 13 of the first and second board bodies 11*a*, 11*b*. This is for avoiding disappearance of vacuumed and airtight state of the internal chamber 13 of the main body 11.

Figure 6:
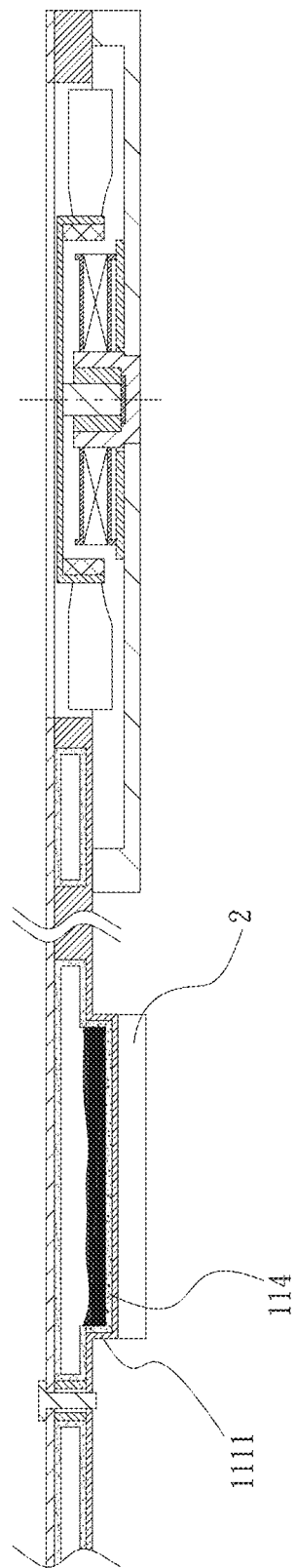
FIG. 6 is a sectional assembled view of a fourth embodiment of the vapor chamber structure of the present invention.

Please now refer to FIG. 6, which is a sectional assembled view of a fourth embodiment of the vapor chamber structure of the present invention. The fourth embodiment is partially identical to the first embodiment in structure and technical characteristic and thus will not be repeatedly described hereinafter. The fourth embodiment is mainly different from the first embodiment in that the heat absorption section 111 has a heat absorption raised section 1111 in contact with the heat source 2. The heat absorption raised section 1111 is directly attached to the heat source 2. The capillary structure 114 in the heat absorption raised section 1111 can be selectively a denser capillary structure 114 with better water-containing capability. This can enhance the water-containing capability of the capillary structure 114 to avoid dry burn.

Figure 7:
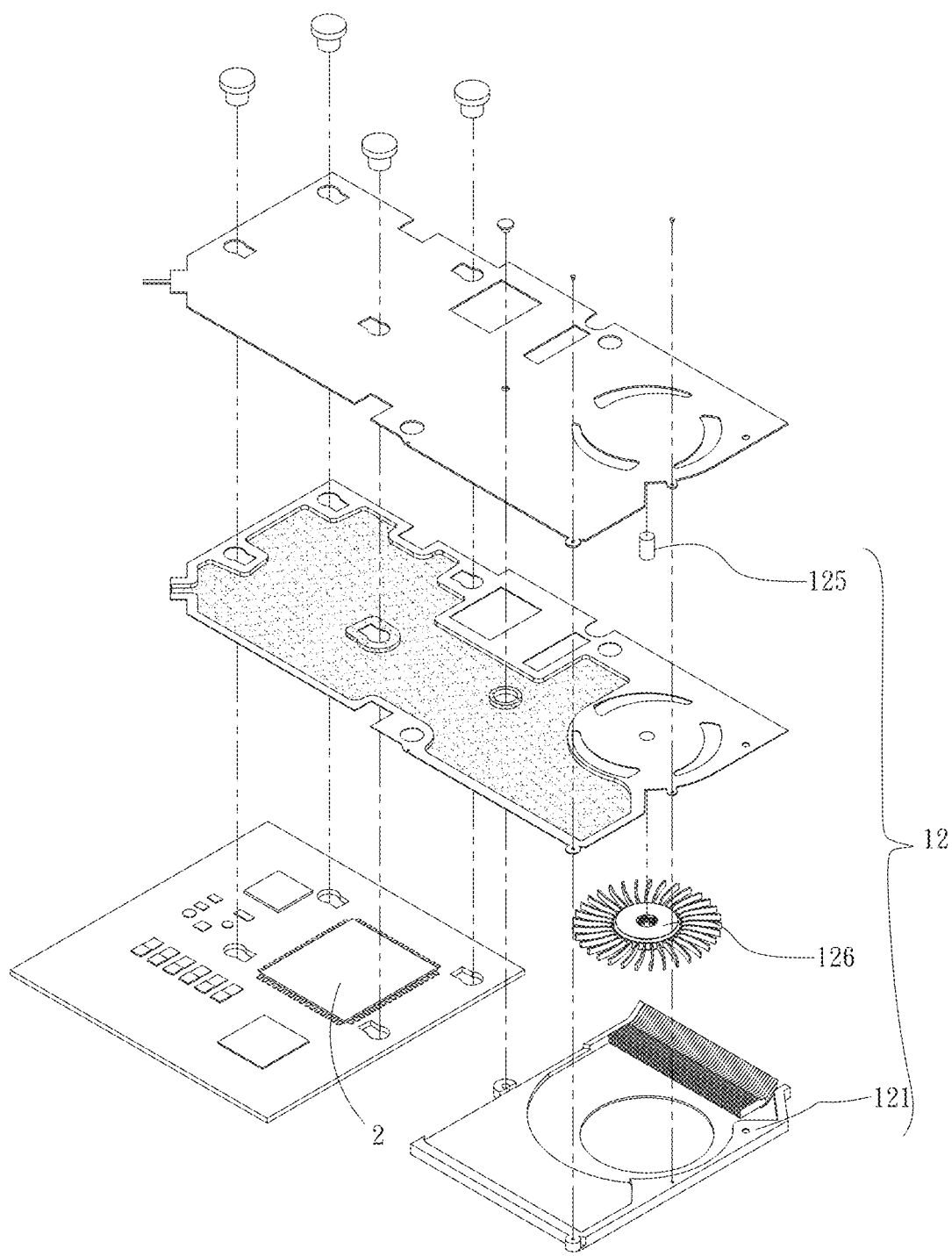
FIG. 7 is a perspective exploded view of a fifth embodiment of the vapor chamber structure of the present invention.

Please now refer to FIG. 7, which is a perspective exploded view of a fifth embodiment of the vapor chamber structure of the present invention. The fifth embodiment is partially identical to the first embodiment in structure and technical characteristic and thus will not be repeatedly described hereinafter. The fifth embodiment is mainly different from the first embodiment in that the fan 12 is a centrifugal fan. The main body 11 is correspondingly disposed on one side of the fan 12. The main body 11 has a bearing cup 125 disposed in a position where the fan 12 is disposed. The fan frame body 121 of the fan 12 is disposed around the bearing cup 125. A fan impeller 126 is rotatably connected with the bearing cup 125.

Figure 8:
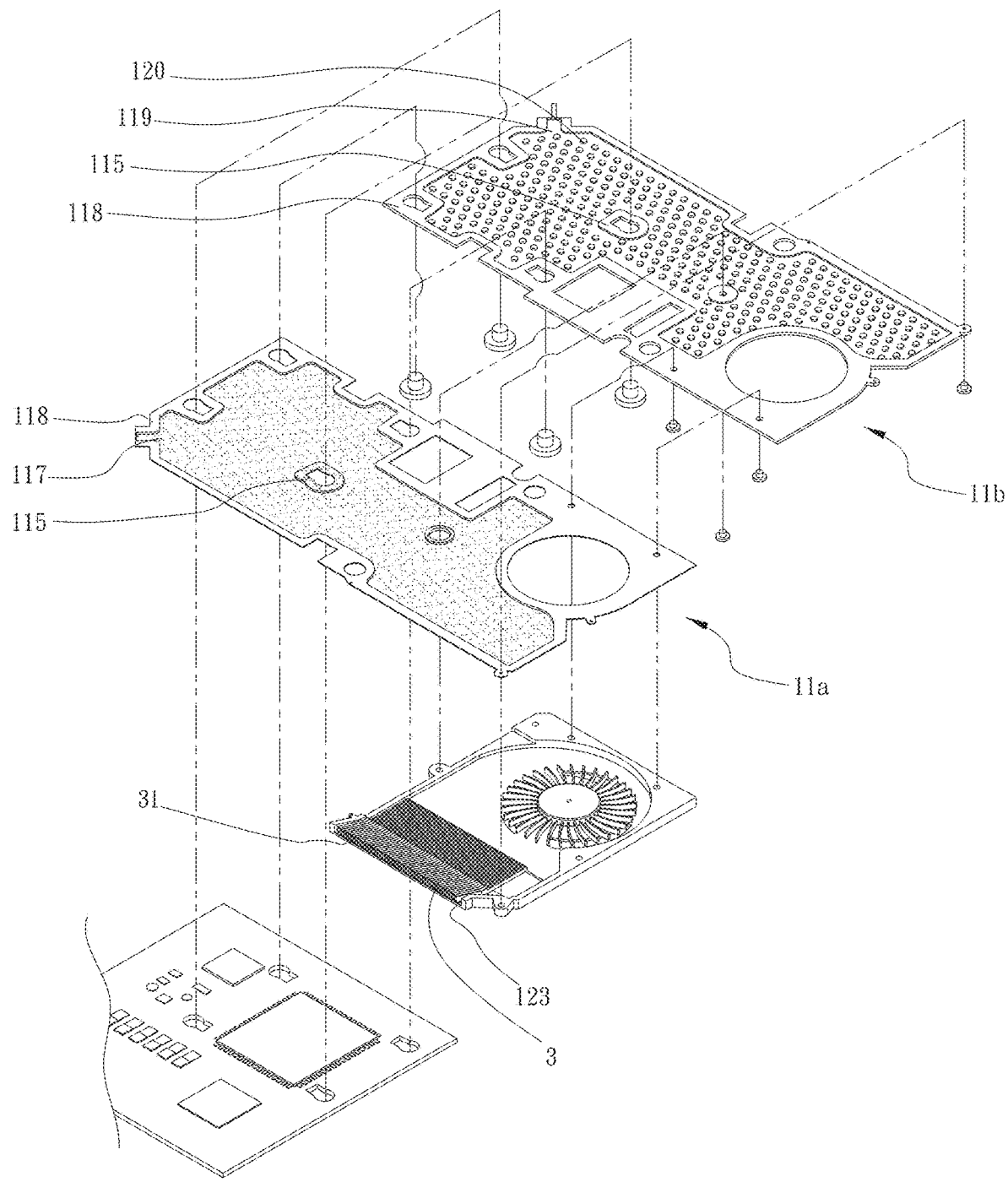
FIG. 8 is a perspective exploded view of a sixth embodiment of the vapor chamber structure of the present invention.
Figure 9:
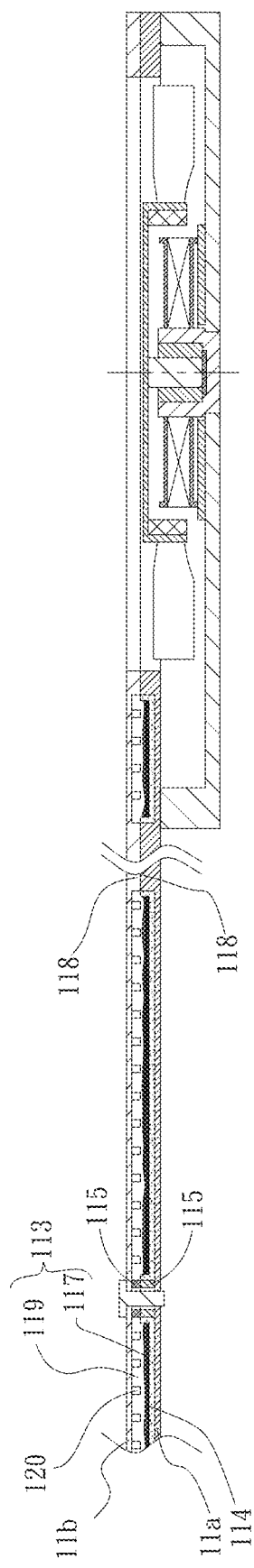
FIG. 9 is a sectional assembled view of the sixth embodiment of the vapor chamber structure of the present invention.

Please now refer to FIGS. 8 and 9. FIG. 8 is a perspective exploded view of a sixth embodiment of the vapor chamber structure of the present invention. FIG. 9 is a sectional assembled view of the sixth embodiment of the vapor chamber structure of the present invention. The sixth embodiment is partially identical to the first embodiment in structure and technical characteristic and thus will not be repeatedly described hereinafter. The sixth embodiment is mainly different from the first embodiment in that the chamber 113 defined between the first and second board bodies 11a, 11b is formed in such a manner that the first and second board bodies 11a, 11b are respectively formed with a first recess 117 and a second recess 119. Each of the first and second recesses 117, 119 has an outer periphery 118. The periphery 118 and the perforated section 115 are raised structures relative to the first and second recesses 117, 119. The perforated sections 115 are disposed in the first and second recesses 117, 119. The peripheries 118 and the perforated sections 115 are mated with each other to connect the first and second board bodies 11a, 11b with each other and achieve an airtight effect for the chamber 113 defined between the first and second board bodies 11a, 11b. The capillary structure 114 disposed in the first recess 117 of the first board body 11a is selected from a group consisting of mesh structure, sintered powder and channeled structure. The capillary structure 114 is made of titanium or stainless steel material or a combination thereof. The capillary structure 114 is a porous multilayered structure body made by means of 3D printing. Multiple bosses 120 are disposed in the second recess 119 of the second board body 11b.

The vapor chamber structure of the present invention can be installed in a narrow internal space of an electronic device to effectively dissipate the heat. Moreover, the vapor chamber is directly assembled with the fan so that the fixing seat of the fan can be saved to save the arrangement space. Furthermore, the perforated section 115 in the chamber 113 serves as a locking point passing through the main body 11. This can ensure the airtight state of the vapor chamber. In addition, the vapor chamber structure of the present invention is an ultrathin vapor chamber structure. The opposite surfaces of the first and second board bodies 11a, 11b are formed with the first recess 117 as the chamber 113 by means of etching. This will not increase the thickness itself. Also, the outer peripheries 118 of the first and second board bodies 11a, 11b and the perforated section 115 in the chamber 113 can be connected by means of diffusion bonding, welding or the like to airtight seal the chamber 113 between the first and second board bodies 11a, 11b. Accordingly, the airtight state of the chamber 113 and the connection between the first and second board bodies 11a, 11b can be maintained. In addition, the peripheries 118 and the perforated section 115 can be perforated to form the through hole 1151 passing through the first and second board bodies 11a, 11b with the vacuumed and airtight state of the chamber 113 remaining unchanged.

The present invention has been described with the above embodiments thereof and it is understood that many changes and modifications in the above embodiments can be carried out without departing from the scope and the spirit of the invention that is intended to be limited only by the appended claims.

What is claimed is:

1. A vapor chamber structure comprising:
a main body formed of a first board body and an opposite second board body, having at least one opening, correspondingly mated with each other to together define a sealed chamber, the main body further having a heat absorption section and a heat dissipation section respectively horizontally disposed on left and right sides of the main body, the heat absorption section being attached to at least one heat source, the chamber being positioned at the heat absorption section and partially extending to the heat dissipation section, the chamber having a capillary structure;
at least one perforated section configured as an independent hollow collar body horizontally positioned centrally in the chamber, aligned with the at least one opening, and having a through-hole and an upper end and a lower end respectively airtightly diffusion bonded vertically with an upper side and a lower side of the chamber, the through-hole extending from the upper end to the lower end of the perforated section and having a diameter greater than a diameter of the at least one opening and with the capillary structure disposed on an outer circumference of the at least one perforated section;
a fan correspondingly assembled on one side of the heat dissipation section of the main body;
a window formed through the main body in a position where the fan is disposed, the window providing an air inlet for the fan; and
multiple perforations formed through the first and second board bodies outside of the chamber.

2. The vapor chamber structure as claimed in claim 1, wherein the fan is a centrifugal fan, the main body being correspondingly disposed on an upper side of the fan, the fan having at least one lateral air outlet.

3. The vapor chamber structure as claimed in claim 1, wherein the fan is connected with the main body by means of riveting, adhesion, screwing or injection molding.

4. The vapor chamber structure as claimed in claim 2, wherein multiple radiating fins are disposed in the lateral air outlet.

5. The vapor chamber structure as claimed in claim 1, wherein the capillary structure is disposed on a wall face of the chamber.

6. The vapor chamber structure as claimed in claim 1, wherein the fan is a centrifugal fan, the main body being correspondingly disposed on one side of the fan, the main body having a bearing cup disposed in a position where the fan is disposed.

7. The vapor chamber structure as claimed in claim 1, wherein the chamber defined between the first and second board bodies is formed in such a manner that one of the first and second board bodies is formed with a first recess and the other board body is correspondingly mated with the board body to seal the first recess, the first recess having an outer periphery, the periphery and the perforated section being raised structures relative to the first recess, the perforated section being disposed in the first recess.

8. The vapor chamber structure as claimed in claim 1, wherein the chamber defined between the first and second board bodies is formed in such a manner that the first and second board bodies are respectively formed with a first recess and a second recess, each of the first and second recesses having an outer periphery, the periphery and the perforated section being raised structures relative to the first and second recesses, the perforated sections being disposed in the first and second recesses, the peripheries and the perforated sections being mated with each other to connect the first and second board bodies with each other and achieve an airtight effect for the chamber defined between the first and second board bodies, the capillary structure disposed in the first recess of the first board body being selected from a group consisting of mesh structure, sintered powder and channeled structure, multiple bosses being disposed in the second recess of the second board body.

9. The vapor chamber structure as claimed in claim 1, wherein the main body is made of titanium or stainless steel material.

10. The vapor chamber structure as claimed in claim 1, wherein the first and second board bodies are made of titanium or stainless steel material.

11. The vapor chamber structure as claimed in claim 8, wherein the capillary structure is made of titanium or stainless steel material or a combination thereof.

12. The vapor chamber structure as claimed in claim 8, wherein the capillary structure is a structure made by 3D printing.

13. The vapor chamber structure of claim 1, wherein the window is formed through both of the first and second board bodies of the main body.

\* \* \* \* \*